(12) United States Patent
Weinzerl et al.

(10) Patent No.: US 6,351,446 B1
(45) Date of Patent: Feb. 26, 2002

(54) OPTICAL DATA STORAGE DISK

(75) Inventors: Helfried Weinzerl, Feldkirch (AT); Dubs Martin, Maienfeld (CH)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/190,538

(22) Filed: Nov. 12, 1998

(30) Foreign Application Priority Data

Oct. 2, 1998 (CH) .............................................. 2009/98

(51) Int. Cl.[7] .................................................. G11B 7/24
(52) U.S. Cl. ..................... 369/275.1; 428/64.4
(58) Field of Search .......................... 369/275.1, 275.2, 369/275.3, 13, 94, 275.4, 288, 283; 428/64.4, 64.5, 64.6, 64.1, 64.7, 694 SC, 694 MT, 694 MM

(56) References Cited

U.S. PATENT DOCUMENTS

| | | | |
|---|---|---|---|
| 5,419,939 A | 5/1995 | Arioka et al. | 428/64.4 |
| 5,620,767 A | 4/1997 | Harigaya et al. | 428/64.4 |
| 5,640,382 A | 6/1997 | Florczak et al. | 369/275.1 |
| 5,673,251 A | 9/1997 | Suzuki et al. | 369/275.4 |
| 5,708,652 A * | 1/1998 | Ohki et al. | 369/275.1 |
| 5,708,653 A * | 1/1998 | Okada et al. | 369/275.1 |

FOREIGN PATENT DOCUMENTS

| | | |
|---|---|---|
| EP | 0406569 | 1/1991 |
| EP | 0720159 | 7/1996 |
| GB | 2017379 | 10/1979 |
| JP | 62060108 | 3/1987 |
| WO | 9967084 | 6/1999 |

* cited by examiner

Primary Examiner—Ali Neyzari
(74) Attorney, Agent, or Firm—Notaro & Michalos P.C.

(57) ABSTRACT

An optical data storage disk has a disk surface and a thickness and includes, in a direction from the disk surface and toward the thickness, at least two spaced-apart interfaces which are each embossed with stored information. An innermost one of the interfaces from the disk surface has a first layer which is reflective for light of a selected wavelength and at an incident angle <90°. The other has a second layer which is partially reflective and partially transmitting for light of the same selected wavelength and incident angle. All remaining material of the disk in the thickness from the disk surface to the innermost interface, substantially transmits light of the selected wavelength. The first and second layers are made of $Ag_xMa_yMb_z$ or $Cu_xMa_yMb_z$, where x>50 at % and Ag or Cu are a first metal, Ma is a second metal and Mb is a third metal.

19 Claims, 2 Drawing Sheets

OPTICAL DATA STORAGE DISK

FIELD AND BACKGROUND FOR THE INVENTION

The present invention deals with an optical data storage disk, at which, considered from a disk surface propagating in direction of the disk thickness extent, at least two interfaces are provided, each of which being profiled according to stored information and whereby the profiled interface disposed innermost comprises a reflection layer, and the at least one further profiled interface comprises a partially reflecting/partially transmitting layer respectively for light of a given wavelength and under the same angle of incidence <90°, whereby further the remaining disk material between the surface and the reflection layer substantially transmits the said light and whereby the reflection layer is made of a first metal alloy, the partially reflecting layer of a second metal alloy.

Such a data storage disk is known from the U.S. Pat. No. 5,640,382. Departing from the one disk surface and propagating in direction of the thickness extent of the disk, such disk comprises first a transparent substrate, then a partially reflecting layer on a first information-profiled interface, then a transmitting distance holder layer and finally a highly reflecting layer on a second information-profiled interface.

The first mentioned transparent substrate may thereby be of a polymer material, as e.g. of polycarbonate, or of amorphous polyolefine. On the other hand it shall be possible too to use glass or a polymethylmetacrylate. It is known (see other publications) to construe such substrate of PMMA.

The distance holder layer further consists e.g. of a polymer. The highly reflecting layer, for laser light between 600 and 850 nm, is made of aluminum, gold, silver, copper or of one of their alloys. The wavelength band for laser light may, as known from other documents, reach down to 500 nm.

Preferably and according to the said U.S. Patent there is used for the partially reflecting layer preferably gold, due to its optical characteristics and especially its stability with respect to ambient influences. Nevertheless, there is recognised that gold is expensive. Therefore, there is further proposed to use gold alloyed with a less expensive metal, so as to reduce costs. Thereby, there is still used 10 at % gold and preferred up to 20 at % gold in the alloy for the partially reflecting layer so as to maintain stability with respect to ambient influences.

As gold alloying metal there is proposed silver or copper.

The U.S. Pat. No. 5,640,382 shall be considered as integral part of the present description with respect to structure of an optical data storage from which the present invention departs.

For such optical data storage disks, e.g. realised as DVD9, Digital Versatile Disks, according to definition in DVD standard "DVD Specifications for Read-Only Disks", Version 1.0 of August 1966, it is requested that at a given wavelength of laser light, especially at 650 nm, the laser light which exits, due to the reflections on one hand at the partially reflecting layer and on the other hand at the reflection layer, comprises respectively 18 to 30% of light applied to the disk. As DVD9 it is customarily understood a "single sided dual layer disk".

SUMMARY OF THE INVENTION

It is an object of the present invention to provide an optical data storage disk as mentioned above which fulfils the specifications as mentioned above with respect to beam splitting, is considerably less expensive with respect to its production, features layers with a chemical resistance with respect to ambient influences, as e.g. with respect to corrosion, which fulfil requirements to a similar extent as do known data storage disks.

This object is resolved at the data storage disk mentioned by the facts that the alloys of the at least two layers comprise one or more than one equal metal(s), whereby said one or said more than one metal(s) commonly represent a fraction of more than 50 at % of the respective alloy, if said alloys comprise gold, this only to a fraction of at most 50 at % of the respective alloy.

By the fact that the alloy comprises one or more than one equal metal(s) with a fraction with respect to the respective alloy of more than 50 at %, it becomes possible to use, at least for this respective fraction of alloy, the same coating source arrangement. Thereby the basic is realised so as to significantly rationalise the manufacturing process for the said data disk. By the fact that further, if at all gold is used at the one and/or the other of the alloys, this is only done with a fraction of at most 50 at % of the alloy material, it is further reached that, also due to costs of the used alloy materials, the inventive disk is of lower costs with respect to manufacturing. Although it is absolutely possible to select the said more than one equal metals which form a fraction of more than 50 at % of the respective alloy materials layer-specifically with different fractions, in a preferred embodiment it is proposed to select the said equal metals at the alloys with equal fractions and thereby preferably to select the fraction of the totality of the said equal metals at the alloy material to be equal.

Thereby, it becomes possible to operate a coating source arrangement for the said equal metals layer-unspecifically, thus equally when depositing both layers.

In a further preferred form of realisation it is proposed that the alloys are formed by equal metals, thereby preferably with the same alloying fractions. Thereby, it is evident that further elements as N, O, Ar may be present just in a trace concentrations. Therewith, the layers may further be deposited with the same coating source arrangement.

In a first especially preferred form of realisation of the inventive data storage disk the mentioned metals which respectively are present with a fraction of more than 50 at % at the respective alloy materials which further preferred make up the alloy are

with x>50%, whereby x may vary layer-specifically within the indicated limit. Ma and Mb thereby indicate respectively a second and third metal.

Further and in an especially preferred form of realisation and especially with using $Ag_xMa_yMb_z$, it is proposed to use palladium as the second metal $M_a$, thereby with y>z, this means with a fraction which is higher than that of an eventually provided third metal Mb. It is to be pointed out that all values indicated in the present description and in the claims for x, y, z shall be understood as at % of 100 at % layer material alloy.

It is further proposed that there is valid:

$0 < y < 10$ and $0 < z < 10$, which means that if the alloys mentioned above consist of the three metals mentioned, there results for Ag and respectively Cu:

$$x=100-y-z.$$

In a further preferred form of realisation without a third metal there is valid:

$$0<y<15 \text{ and}$$
$$z\approx0,$$

which leads to silver-palladium alloy layers and/or to Cu-palladium layers, thereby clearly preferring silver-palladium layers.

Thereby, it is further proposed that there is valid:

$$5<y<10 \text{ and}$$
$$z\approx0,$$

which is especially preferred for silver alloy layers with palladium, thereby preferably for layers which exclusively consist of the silver-palladium alloy.

Especially for such layers, namely of silver-palladium alloys, it is proposed to select:

$$y=8 \text{ and } z\approx0.$$

Although these values are also preferred for $$Cu_xMa_yMb_z,$$

especially also for copper-palladium alloys, it is most preferred to make use respectively of a silver-palladium alloy or of an alloy which comprises respectively silver and palladium to a fraction of more than 50 at %.

As the above mentioned second or third metal Ma, Mb respectively and especially as Ma, in this case instead of palladium indicated as preferred, one may also use gold with $$y>z.$$

If for the said at least two layers the same alloy is used and thus the index of refraction of both alloys may be indicated by n and the absorption coefficient with k, there is preferably valid:

$$0<n/k\leq0.28,$$

and thereby especially preferred $$0<n/k\leq0.20.$$

This is valid for light with $\lambda=650$ nm and the layer material in bulk form. Thereby the characteristics of the reflection layer substantially accords to the characteristics of the material in bulk form due to the thickness of that layer. Further there is valid for all metal alloys k>2.

In a further preferred form of realisation of the inventive data storage disk the stability of the optical characteristics, especially of the layers, thus reflection, transmission and absorption, is better than ±2%, even better than ±1% when exposed to air during 24 h.

An inventive manufacturing method is characterised by the wording of claim 11, thereby a preferred variant thereof by the wording of claim 12.

Further, the above mentioned object, with respect to specifications, low cost manufacturing and chemical resistance, is already resolved by the fact that irrespective of the realisation of the reflection layer, the partially reflecting layer consists of $$Ag_xMa_yMb_z,$$

or of $$Cu_xMa_yMb_z$$

with x>50%, whereby there stands:

Ma: for a second metal, besides of gold

Mb: for a third metal, preferably excluding gold.

Thereby it is possible to realise principally large cost savings even when construing deposition of the reflection layer e.g. of an aluminum alloy compared with depositing well-known alloys for the partially reflecting layer.

In a preferred embodiment the partially reflecting layer consists of $Ag_xMa_yMb_z$, and there is applied as the second metal Ma palladium. There is thereby valid y>z.

Further, there is preferably valid at the partially reflecting layer:

$$0<y<10 \text{ and}$$
$$0<z<10.$$

On the other hand there is valid in a further preferred embodiment and with respect to the partially reflecting layer:

$$0<y<15$$
$$z\approx0,$$

and thereby preferably $$5<y<10,$$

further with $$z\approx0.$$

In a today especially preferred partially reflecting layer, especially consisting of the AgPd alloy, there is valid:

$$y=8$$
$$z\approx0.$$

Attention is especially drawn to the high ambient stability of the mentioned alloys and especially of the AgPd alloy, exploited as a material for the partially reflecting layer, as will be apparent from the following description.

BRIEF DESCRIPTION OF THE DRAWINGS

The invention will now be exemplified by examples and by means of figures. The figures show.

DESCRIPTION OF THE PREFERRED EMBODIMENTS

Figure 1:
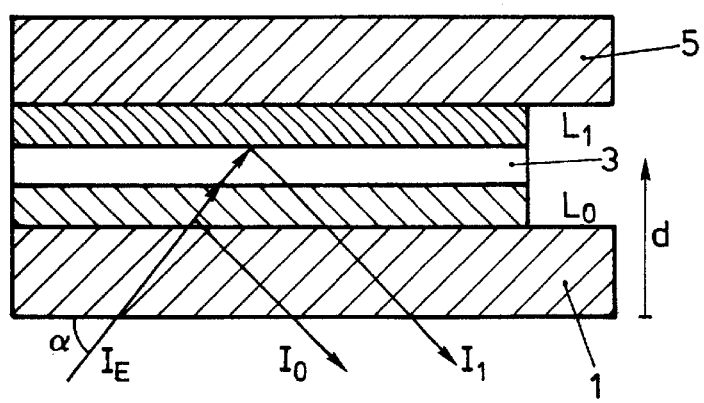
FIG. 1 schematically a cross-section through an optical data storage disk with double information carrier interface, FIG. 2 the characteristic of the absorption as a function of the ratio n/k of layer material, FIG. 3a at a preferred embodiment of an inventive optical data storage disk the absorption, transmission and reflection characteristics, measured at the partially reflecting layer just after manufacturing, FIG. 3b in a representation in analogy to that of FIG. 3a the said characteristics after 13 hours exposure to air, FIG. 3c in a representation in analogy to that of FIGS. 3a and 3b the said characteristics after 37.5 hours exposure to ambient.

In FIG. 1 there is schematically shown an optical data storage disk according to that kind which is referred to in the present application. The disk comprises, departing from one of the disk surfaces and propagating in direction d towards the inside of the disk, a substrate 1, which is transparent especially for light with $\lambda=650$ nm, which substrate being preferably of polycarbonate. There follows a partially reflecting, partially transmitting layer $L_o$. There further follows a spacer layer 3, e.g. a glue-layer, which is transparent too, especially for the said light, and then a partially reflection layer $L_1$, all on a carrier 5, which is e.g. again of polycarbonate. At the interfaces 1/3 and 3/5 respectively provided with the layers $L_o$, $L_1$ there are provided information embossment patterns.

Laser light $I_E$ with 500 nm $\leq \lambda \leq 8580$ nm, preferably with $\lambda=650$ nm, is directed under an angle $\alpha<90°$ onto the storage disk and is partially reflected at the partially reflecting layer $L_o$, thereby emanating with the part $I_o$. Light which is partially transmitted at $L_0$ is practically completely reflected at the reflection layer $L_1$ and emanates with the part $I_1$.

If and according to a far preferred form of realisation of the present invention there is established that the metal alloys of the layers $L_1$ and $L_0$ are equal, then for both alloys the index of refraction may be approximated by n and the absorption coefficient by k. Thereby, the absorption coefficient k of metal and metal alloys respectively is customarily $k>2$.

Figure 2:
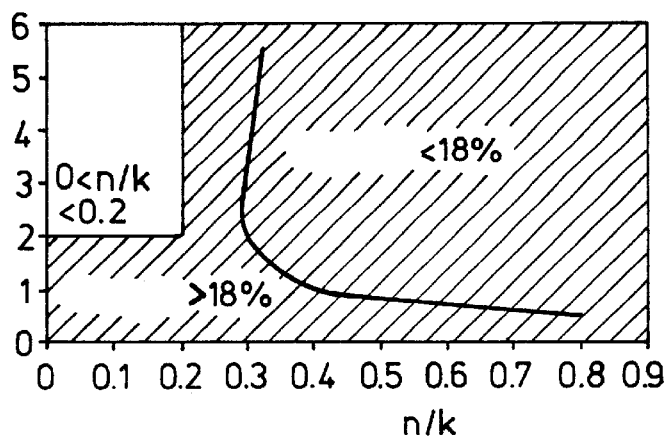

In FIG. 2 the course of the absorption coefficient is shown as a function of the ratio n/k as having been calculated. Thereby, there was departed from a condition where the signals $I_o$ and $I_1$ are perfectly balanced and further where the reflection distribution along the disk is perfect (±0%) and further where no further losses occur. From FIG. 2 there might be seen that there is to be established a n/k ratio for which there is valid:

$$0<n/k<0.28,$$

thereby preferably $$0<n/k<0.20,$$

so that signal values of more than 18% are realised.

Thereby, the course according to FIG. 2 is valid for light with a wavelength $\lambda=650$ nm and for bulk material. The conditions at the reflection layer $L_1$ according to FIG. 1 substantially accord with the optical characteristics at bulk material.

In reality one must face the following influences:

Signal losses of 5 to 10%, e.g. by double diffraction in substrate 1, scattering losses due to the information embossment patterns, reproducibility of reflection, reflection distribution along the disk, estimated to be ±1% and, respectively, 1,5%.

The signal calculated on the basis of characteristics of the bulk material, which accords substantially to $I_1$ of FIG. 1, shall be larger than 22 to 23% $I_E$, so that even in industrial mass production the signal is kept larger than 18%. For such an industrial production there is thus preferred:

$$0<n/k<0.2$$

so as to ensure lowest possible production spoilage.

For the selection of the alloy and preferable for equal alloys with equal metal fractions for both layers $L_0$, $L_1$, there result, thereby fulfilling the required conditions with respect to chemical resistance and with lowest possible fraction of gold the following alloys as a universal layer material:

Silver-palladium Alloys

By means of DC sputtering of a silver-palladium alloy target $Ag_{92}Pd_8$. layers were deposited. As a reflection layer $L_1$ the alloy layer was deposited with a thickness larger than 60 nm, thereby preferred with a thickness larger than 75 nm. Sputtering was realised with a growing rate of 13 nm/kW sec. The optical characteristics accord largely with the optical characteristics of the silver-palladium alloy in bulk form. The following values were measured:

Reflection: 90%

Absorption: 10% n: 0.511 k: 3.74 n/k: 0.136

From these values there may be seen that the silver-palladium alloy mentioned exhibits a n/k value of 0.136. For the values realised at bulk material there may now be calculated a suitable layer thickness of 13 to 17 nm for the partially reflecting layer according to $L_o$ of FIG. 1.

Figure 3A:
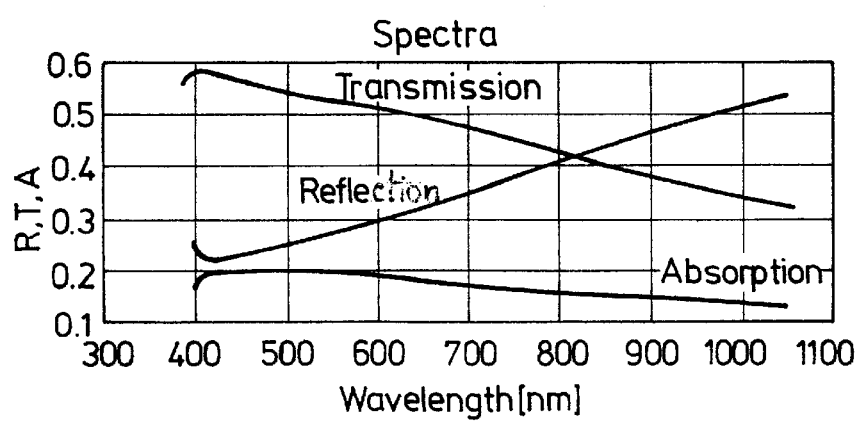

For such a partially reflecting layer there resulted the optical behaviour according to FIG. 3a with respect to transmission, reflection and absorption, and this just after its manufacturing.

Figure 3B:
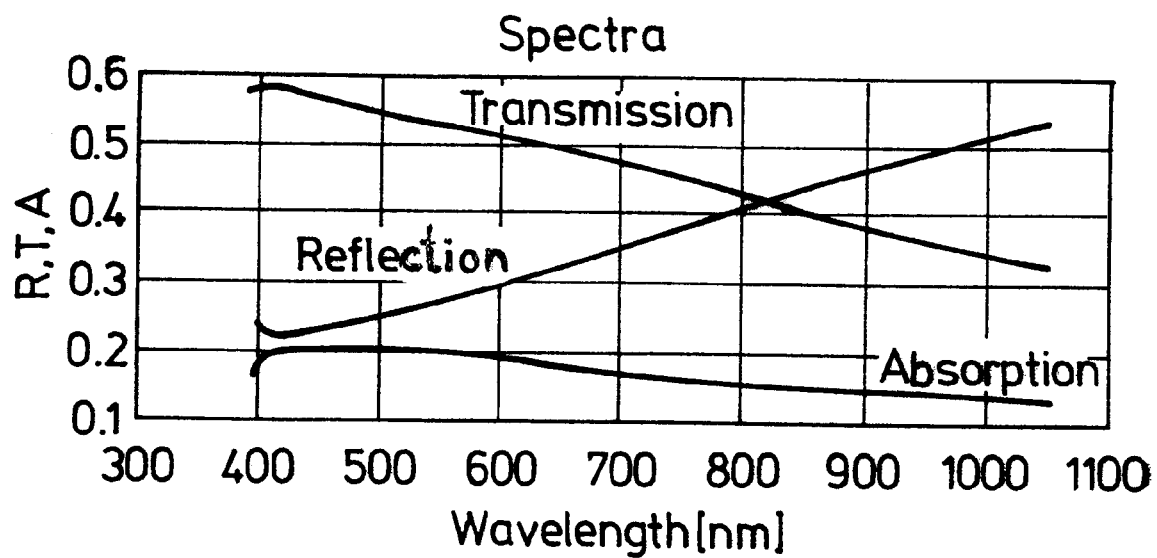
Figure 3C:
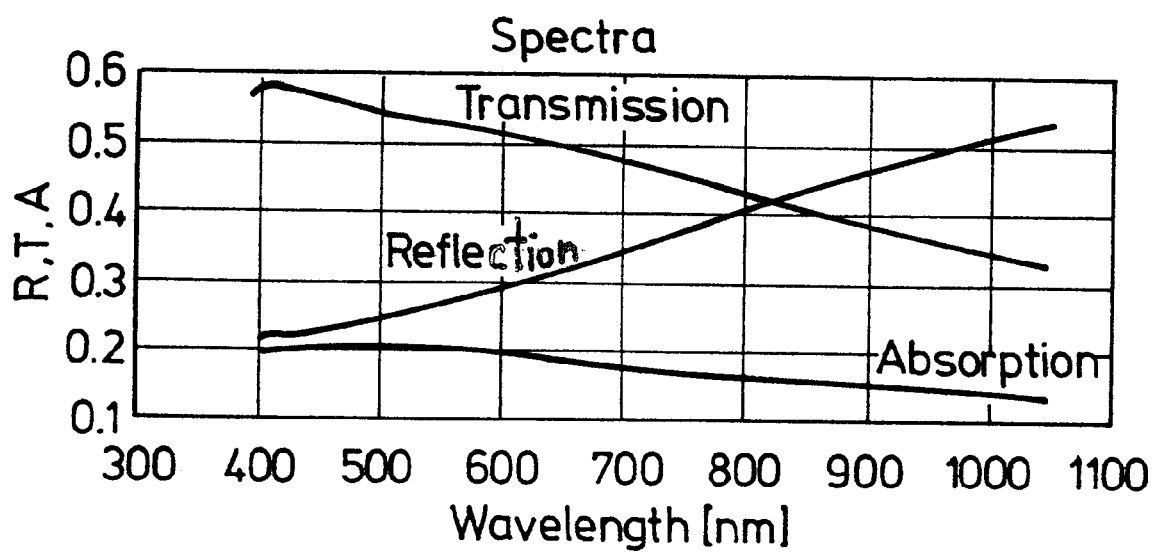

After 13 hours there resulted characteristics according to FIG. 3b and finally, after 37.5 hours exposure to ambient, according to FIG. 3c.

From this it becomes clear that the inventively realised layers are extremely stable with a stability of their optical characteristics, namely of reflection, transmission and absorption in the entire monitored range of 500 to 900 nm being better than ±2%, exposed during at least 24 hours to ambient. The especially preferred silver-palladium alloy exhibits according to the figs. mentioned a stability which is even better than ±1%.

This material may be deposited by means of a customary DC sputtering process with a very high deposition rate. Compared with a gold coating the costs for a silver-palladium coating are approx. 80% to 90% lower.

Thus, there is found with the silver-palladium alloy as mentioned a universal material for layers at optical data disks of the kind as mentioned above.

Further silver-palladium alloys $Ag_xPd_y$ with alloy fractions y of palladium $0<y<15$ and therefore $x=100-y$ will most probably exhibit similarly good results as wells as alloys $Ag_xPd_yMb_z$ with $0<y<10$ and $0<z<10$. Thereby Mb may e.g. be gold.

After having found by means of experiments at silver-palladium alloys the rules and the feasibility of the solution of the basic object of the present invention, there further results that e.g. silver-gold alloys too are suited as a universal material for both layers, as a $Ag_{60}Au_{40}$ alloy exhibits a n/k value of 0.079 and a $Ag_{50}Au_{50}$ alloy a n/k value of 0.108.

All alloys $Ag_xAu_y$ with $0<y<50$ and thus with $x=100-y$ and, respectively, alloys $Ag_xAu_yMb_z$ with $x>50$, $0<y<50$, $0<z<10$ and thus with $x=100-y-z$ may be considered as universal materials.

Copper-gold alloys too revealed to be suited as universal materials:

$Cu_{50}Au_{50}$ alloys have a n/k value of 0.142, and $Cu_{60}Au_{40}$ of 0.156.

Generically all alloys $Cu_xAu_y$ with $0<y<50$ and thus with $x=100-y$ and, respectively, alloys $Cu_xAu_y Mb_z$ with $x>50$, $0<y<50$, $0<z<10$ and thus with $x=100-y-z$ may be used as universal materials. With a high probability this is also valid for copper-tin alloys (bronze) as well as for copper-palladium alloys.

For the manufacturing of the optical data storage disks there is used for all the layers a main coating source, preferably even only one coating source for all the layers. Thereby, a DC sputter source is especially suited, as e.g. a DC magnetron source with the alloy composition selected as target material. Metal fractions which vary from layer to layer, if desired, may be realised by means of varying the process control at such deposition source. Further, there may be installed for deposition of the layers an extremely small substrate to source spacing, and the substrate may be coated held stationary with respect to the source, which leads, overall, to a compact and cost effective manufacturing plant.

With respect to the especially preferred silver-palladium alloy one can further say that this material is utmost stable with respect to ambient influences and exhibits a high sputtering yield in layer deposition.

The proposed universal materials are considerably less expensive than gold. Due to the features of providing at least one basic alloy part for both layers which is made of the same metals and thereby preferably manufacturing both layers of the same alloy, it becomes possible to manufacture the inventive data storage disk with a single coating apparatus, especially with a single sputtering apparatus, thereby preferably with a single source.

What is claimed is:

1. An optical data storage disk having a disk surface and a thickness and comprising: in a direction from the disk surface and toward the thickness, at least two spaced-apart interfaces which are each embossed with stored information; an innermost one of the at least two interfaces from the disk surface comprising a first layer of a first metal alloy which is reflective for light of a selected wavelength and at an incident angle <90°; the other of the at least two interfaces comprising a second layer of a second metal alloy which is partially reflective and partially transmitting for light of the same selected wavelength and incident angle; all remaining material of the disk in the thickness from the disk surface to the innermost one of the interfaces substantially transmitting light of the selected wavelength; the first and second metal alloys both including at least one selected metal that is the same for both alloys; said selected metal amounting to a fraction in each respective alloy of more than 50 at %; and the first and second metal alloys each consisting essentially of either $Ag_xMa_yMb_z$ or $CU_xMa_yMb_z$, and Ag or Cu are the selected metal, Ma is a second metal and Mb is a third metal.

2. A data storage disk according to claim 1, wherein the first and second metal alloys consist essentially of $Ag_xMa_yMb_z$, the second metal is palladium, and $y>z$.

3. A data storage disk according to claim 1, wherein: $0<y<10$; and $0<z<10$.

4. A data storage disk according to claim 1, wherein the first and second metal alloys consist essentially of $Ag_xMa_yMb_z$, the second metal is palladium, and wherein $0<y<15$; and z is about equal to zero.

5. A data storage disk according to claim 1, wherein the first and second metal alloys consist essentially of $Ag_xMa_yMb_z$, the second metal Ma is gold, and $y>z$.

6. An optical data storage disk having a disk surface and a thickness and comprising: in a direction from the disk surface and toward the thickness, at least two spaced-apart interfaces which are each embossed with stored information; an innermost one of the at least two interfaces from the disk surface comprising a first layer of a first metal alloy which is reflective for light of a selected wavelength and at an incident angle <90°; the other of the at least two interfaces comprising a second layer of a second metal alloy which is partially reflective and partially transmitting for light of the same selected wavelength and incident angle; all remaining material of the disk in the thickness from the disk surface to the innermost one of the interfaces substantially transmitting light of the selected wavelength; the first and second metal alloys both including at least one selected metal that is the same for both alloys; said selected metal amounting to a fraction in each respective alloy of more than 50 at %; and the first and second metal alloys being each the same, each metal alloy having a ratio n/k between its reflection coefficient n and its absorption coefficient k, for the metal alloy in the bulk and for light of 650 nm, such that: $0<n/k<0.28$.

7. A data storage disk according to claim 6 wherein:

$$0 \leq n/k \leq 0.20.$$

8. An optical data storage disk having a disk surface and a thickness and comprising: in a direction from the disk surface and toward the thickness, at least two spaced-apart interfaces which are each embossed with stored information; an innermost one of the at least two interfaces from the disk surface comprising a first layer of a first metal alloy which is reflective for light of a selected wavelength and at an incident angle <90°; the other of the at least two interfaces comprising a second layer of a second metal alloy which is partially reflective and partially transmitting for light of the same selected wavelength and incident angle; all remaining material of the disk in the thickness from the disk surface to the innermost one of the interfaces substantially transmitting light of the selected wavelength; the first and second metal alloys both including at least one selected metal that is the same for both alloys; said selected metal amounting to a fraction in each respective alloy of more than 50 at %; and the first and second metal alloys each consisting essentially of either $Ag_xMa_yMb_z$ or $CU_xMa_yMb_z$, and Ag or Cu are the selected metal, Ma is a second metal and Mb is a third metal.

9. A data storage disk according to claim 1, wherein the first and second metal alloys each comprise a gold-free metal alloy, the second layer consisting essentially of either $Ag_xMa_yMb_z$ or $Cu_xMa_yMb_z$ where $x>50$ at % and Ag or Cu are the selected metal, Ma is a second metal other than gold, and Mb is a third metal other than gold.

10. A data storage disk according to claim 9, wherein the second metal alloy consist essentially of $Ag_xMa_yMb_z$, the second metal is palladium, and $y>z$.

11. A data storage disk according to claim 9, wherein: $0<y<10$; and $0<z<10$.

12. A data storage disk according to claim 9, wherein: $0<y<15$; and z is about zero.

13. A data storage disk according to claim 9, wherein: $5<y<10$; and z is about zero.

14. A data storage disk according to claim 9, wherein: $y=8$; and z is about zero.

15. A data storage disk according to claim 1, wherein the selected metal is present in both said first and second metal alloys in the same fractional amount.

16. A data storage disk according to claim 1, wherein the first and second metal alloys are the same in the metals present in each alloy and in the fractional amounts of each metal present in each alloy.

17. A data storage disk according to claim 1, wherein the first and second layers are both deposited by DC sputtering of said selected metal.

18. A data storage disk according to claim 17, wherein the DC sputtering is of the same target that is made of the selected metal.

19. A data storage disk according to claim 1, wherein: at least one of y and z is larger than zero.

* * * * *